United States Patent [19]

Laug et al.

[11] 4,415,974
[45] Nov. 15, 1983

[54] AIRSPEED DISPLAY SCALE WITH INTEGRAL TREND INDICATION

[75] Inventors: Owen B. Laug, Barnesville; Charles C. Gordon, Bethesda; Robert O. Stone, Gaithersburg, all of Md.

[73] Assignee: The United States of America as represented by the Secretary of the Navy, Washington, D.C.

[21] Appl. No.: 272,624

[22] Filed: Jun. 11, 1981

[51] Int. Cl.³ .............................................. G06F 15/50
[52] U.S. Cl. ................................... 364/426; 364/427; 364/428; 364/433; 364/435
[58] Field of Search .............. 364/426, 427, 428, 433, 364/162; 340/722, 753, 754, 62, 669

[56] References Cited

U.S. PATENT DOCUMENTS

| 3,128,445 | 5/1964 | Hosford | 340/37 |
| 4,176,546 | 12/1979 | Gibson et al. | 73/181 |
| 4,251,868 | 2/1981 | Aron et al. | 364/427 |

Primary Examiner—Gareth D. Shaw
Assistant Examiner—Stuart Dwork
Attorney, Agent, or Firm—R. S. Sciascia; A. L. Branning; J. G. Wynn

[57] ABSTRACT

A digitally activated display scale in association with digital-electronic circuitry, displays both the airspeed and airspeed trend of a landing aircraft. The digital/electronic circuitry process an analog voltage corresponding to an airspeed range of 80 to 179 knots to produce a digital number representative of the airspeed of the landing aircraft. The digital number is used to produce a continuous display of the airspeed and to indicate the trend of the airspeed as either increasing or decreasing.

6 Claims, 3 Drawing Figures

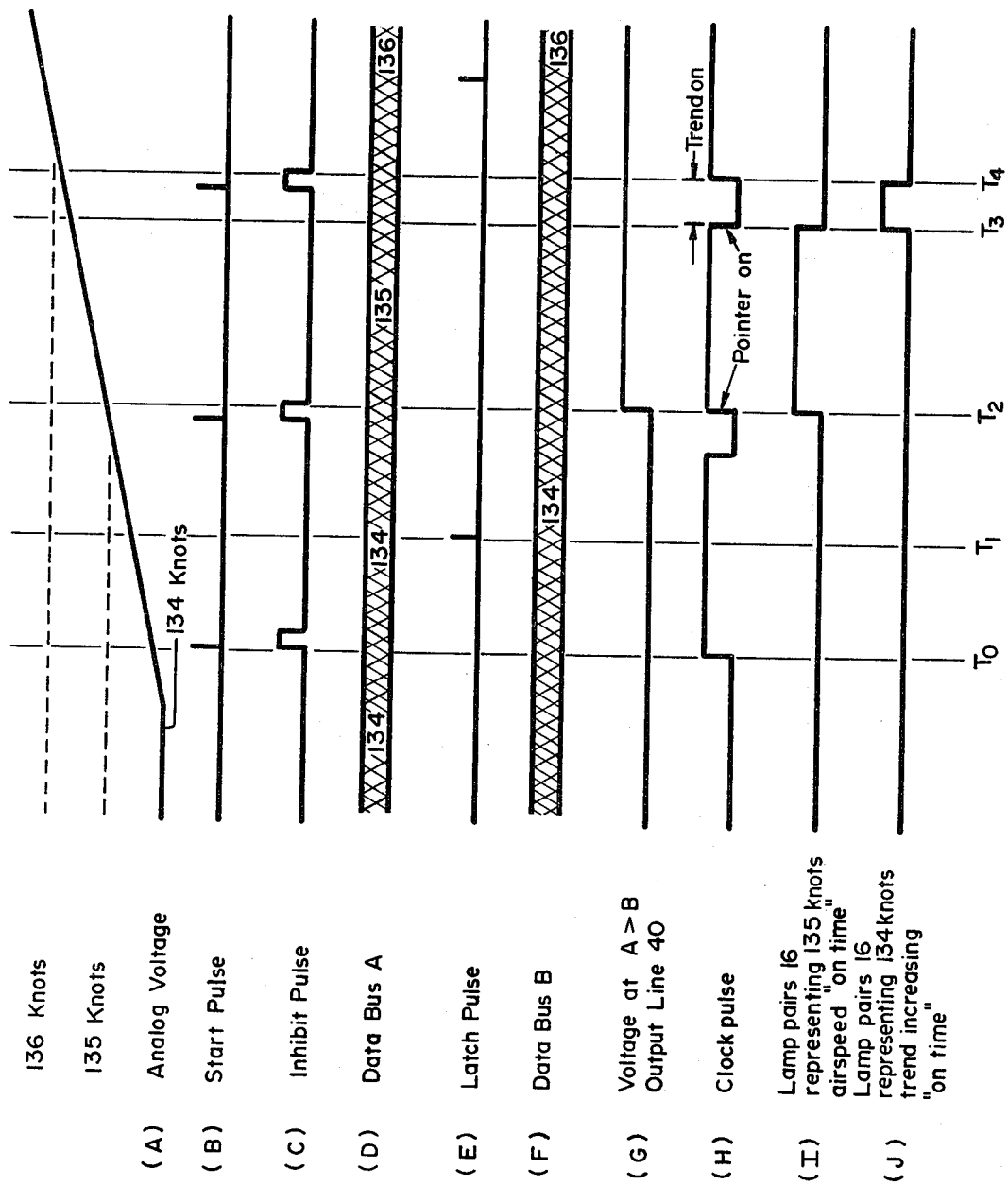

AIRSPEED DISPLAY SCALE WITH INTEGRAL TREND INDICATION

BACKGROUND OF THE INVENTION

1. Field of the Invention

The present invention relates in general to a display scale for indicating the airspeed of a landing aircraft, and more particularly to a linear digitally activated display scale for displaying the airspeed and indicating the trend of the airspeed as either increasing or decreasing.

2. Description of the Prior Art

In the past, on aircraft carriers, at the Landing Signal Officer's (hereinafter LSO) control console, the technique for displaying airspeed was to use a synchro-indicator device for driving a pointer to indicate airspeed on a circular scale. The range of airspeed from 40 to 200 knots was far greater than required by the LSO. A range of 80 to 179 knots is adequate and will provide better resolution. The airspeed dial pointer did not indicate "changes" in the airspeed but only actual airspeed. Airspeed "changes", "decelerations" and "accelerations" as they are referred to by LSO's, are predictive of changes in glide-slope performance. Consequently, there is a need in the prior art to provide an airspeed display scale and associated equipment that will indicate both airspeed and airspeed change information, i.e., trend, to eliminate the circular dial and pointer systems which are difficult to read during some light levels of landing operations and to provide a linear scale with proper light level outputs.

In addition, one of the old techniques required the LSO to observe the airspeed scale for a longer interval of time in order to determine the trend of the airspeed, i.e., the trend could not be determined instantaneously. Another old technique required the assistant LSO to call out the airspeed readings and indicate as to whether each reading was increasing or decreasing. This technique, of course, had the added disadvantage of requiring the assistant LSO to make sure he was heard over aircraft noise and deck noise. Hence, there is a needed in the prior art to provide a linear display scale which is impervious to environmental noises and needs only one LSO for proper observation to properly operate.

Prior to the present invention, other techniques were investigated including the use of a servo-mechanism to drive a belt which carried a lit pointer along a linear scale. The foregoing technique and others using similar devices proved to have maintenance and mechanical limitations in terms of repeatability, stability and accuracy. Thus, there is a need in the prior art to furnish a linear digitally activated display scale which produces a continuous display of the airspeed and indicates the trend of the airspeed as either increasing or descreasing but yet be accurate and reliable.

The prior art as indicated hereinabove, include many advances in airspeed display scales. However, insofar as can be determined no prior art scale or indicator incorporates all of the features and advantages of the present invention.

OBJECTS OF THE INVENTION

Accordingly, a principal object of the present invention is to produce a continuous display of the airspeed of a landing aircraft in an improved manner.

Another object of the present invention is to indicate the trend of the airspeed of a landing aircraft as either increasing or decreasing in an improved manner.

Yet another object of the present invention is to provide display information which is visible over a wide range of ambient deck lighting conditions from night to sunlight daytime landings in an improved manner.

SUMMARY OF THE INVENTION

In accordance with the above stated objects, other objects, features and advantages, the present invention has a primary purpose to produce a continuous and readable display of the airspeed, and the trend of the airspeed of a landing aircraft as either increasing or descreasing.

The essence of the present invention is in the use of a linear airspeed digitally activated display scale with an integral airspeed trend indication. Digital/electronic circuitry, according to the present invention, process an analog voltage, representing an airspeed range of 80 to 179 knots, generated by the SPN-42 radar system of the Automatic Carrier Landing System (ACLS) of an associated aircraft carrier, to produce a digital representation of the airspeed of the landing aircraft. The airspeed is indicated by one of a plurality of lamp pairs being lit, a "pointer on" condition, to represent an airspeed within 80 to 179 knots. An adjacent one of the plurality of lamp pairs being lit at a lower intensity indicates the trend of the airspeed as either increasing or decreasing. When the trend indication is to the right of the "pointer on" lamp pairs, the airspeed has been higher and is decreasing. When the trend indication is to the left, the airspeed has been lower and is increasing. Each one of the plurality of lamp pairs is contained in juxtaposed cubicles to make up a linear scale corresponding to the airspeed range of 80 to 179 knots.

BRIEF DESCRIPTION OF THE DRAWINGS

The previously stated objects, other objects, features and advantages of the present invention will be apparent from the following more particular description of the preferred embodiment as illustrated in the accompanying drawings, in which:

FIG. 3 is a timing diagram showing the interrelationship of various waveforms generated in the digital/electronic circuitry of FIG. 2 during the operation thereof.

BRIEF DESCRIPTION OF THE PREFERRED EMBODIMENT

Figures 1, 2:
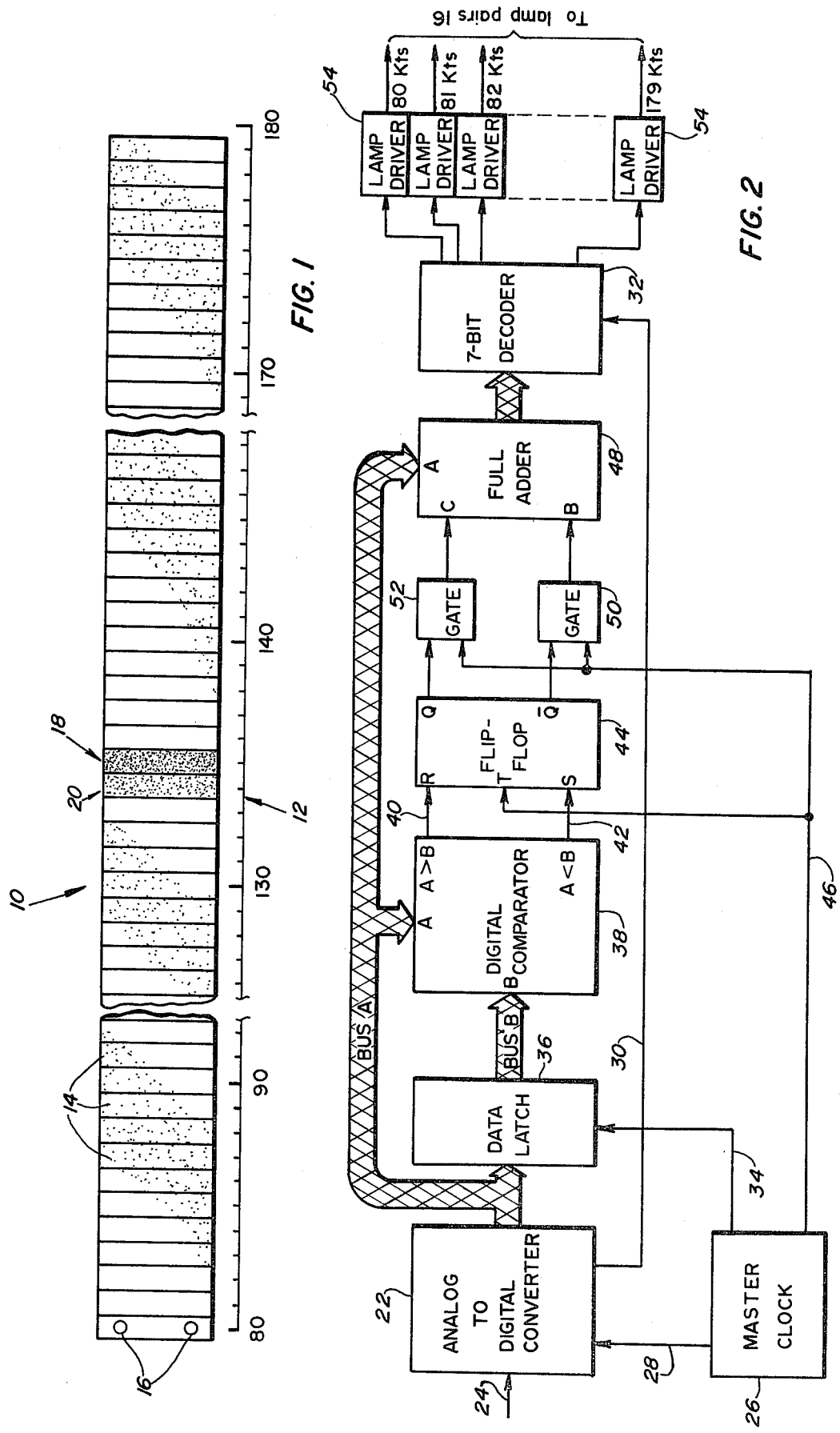
FIG. 1 is a pictorial representation of the linear digitally activated display scale, according to the present invention, showing among other things, one of a plurality of lamp pairs and how each one is disposed in a corresponding plurality of juxtaposed cubicles.
FIG. 2 is a block diagram representation of the associated digital/electronic circuitry, according to the present invention, used to drive the linear digitally activated display scale.

FIGS. 1 and 2 show a linear digitally activated airspeed/trend indicator and an associated digital/electronic circuitry, respectively, in which the present invention is employed to display the trend of a landing aircraft's airspeed as decreasing or increasing simultaneously with an airspeed indication. FIG. 3 depicts the timing diagram for the indicator and circuitry during the operation thereof. FIG. 1 will be fully described in this section, and FIGS. 2 and 3, along with some reference to FIG. 1, will be described in the section entitled, "Statement of the Operation", hereintofollow.

Referring then to FIG. 1, a linear digitally activated airspeed indicator 10 includes a linear scale 12 in alignment and cooperation with a plurality of juxtaposed display cubicles 14 for indicating and displaying the airspeed and airspeed trend as increasing or decreasing in the range of 80 to 179 knots. There are on hundred (100) juxtaposed display cubicles 14 one for each airspeed indication in knots on linear scale 12 except for 180 knots. For purposes of the present invention, plurality of juxtaposed display cubicles 14 are disposed contiguous to adjacent ones of each other horizontally to form an indicator of approximately 15 inches for the 80 to 179 knots to conform with corresponding marks on linear scale 12. Thus, each juxtaposed display cubicle 14 is about 0.15 inch wide, and 0.5 inch high. For purposes of the present invention, each one of juxtaposed display cubicles 14 is frosted on its front surface to diffuse the light from a plurality of lamp pairs 16 and distribute it evenly across the front surfaces, thereby eliminating point sources of light. A polarizer (not shown) covers the indicator 10 to reduce internal reflections from high external ambient light.

Still referring to FIG. 1, the airspeed is indicated by plurality of lamp pairs 16 (only one pair shown) each pair disposed in each one of plurality of juxtaposed display cubicles 14 and connected in parallel to increase brightness and to increase reliability of operation. Hence, when a lamp pairs 16 is lit it can represent an airspeed from 80 to 179 knots. When the lamp pairs 16 disposed in the last juxtaposed display cubicle 14 corresponding to 179 knots is lit, the interpretation should be that the airspeed is 179 knots or greater. When the lamp pairs 16 disposed in the juxtaposed display cubicle 14 corresponding to 80 knots is lit the interpretation should be that the airspeed is 80 knots or less.

A typical airspeed indication is shown in FIG. 1 where an airspeed of 135 knots is represented by a "pointer on" condition at numeral 18. An adjacent lamp pairs 16, being lit at a lower intensity indicates the airspeed increasing from 134 knots is represented by a "trend" condition at numeral 20. When the "trend" indication is to the left of the airspeed indication, as in FIG. 1, the airspeed has been lower and is increasing. When the "trend" indication is to the right of the airspeed indication, the airspeed is decreasing.

STATEMENT OF THE OPERATION

Details of the operation, according to the present invention, is explained in conjunction with FIGS. 1, 2 and 3 viewed concurrently.

Referring primarily to FIGS. 2 and 3, a linear analog voltage, shown in FIG. 3-A, is inputted to an analog-to-digital converter 22 via analog voltage input line 24. Conversion in analog-to-digital converter 22 to a 7-bit digital number is initiated by a start pulse at a time $T_0$, shown in FIG. 3-B, from a master clock 26 on start pulse line 28. During the conversion period of approximately 20 microseconds, analog-to-digital converter 22 generates an inhibit pulse, shown in FIG. 3-C, on inhibit pulse line 30 which inhibits a 7-bit decoder 32. Accordingly, plurality of lamp pairs 16 (see FIG. 1) are kept off during this brief conversion period to prevent erroneous flickering.

Still referring primarily to FIGS. 2 and 3, at an arbitrary time $T_1$ after the inhibit pulse, shown in FIG. 3-C, has ended, data is valid on data bus A, illustrated in FIG. 3-D. Master clock 26 generates a latch pulse, shown in FIG. 3-E, on latch pulse line 34 which is operatively connected to data latch 36. As shown, a latch pulse occurs for every other start pulse, i.e., one-half the frequency of the start pulses. For purposes of the present invention, the frequency of the start pulses is at least 60 Hz but preferably is 144 Hz. After the latch pulse has ended, data from data bus A is stored in data latch 36.

In the example depicted in FIG. 3, a data value of 134 knots is stored in data latch 36 and is present on data bus B, illustrated in FIG. 3-F. Meanwhile, the next start pulse, slightly before a time $T_2$, and the attendant inhibit pulse are generated in order to update the data on data bus A. Since the linear analog voltage, shown in FIG. 3-A, has increased from 134 knots to a value of 135 knots, the new value of data on data bus A will become 135 knots at time $T_2$. A digital comparator 38 compares the value of the data on data bus A with the value of the data on data bus B. Since in the example shown, data bus A has a greater value than data bus B, digital comparator 38 will output a logical "1" on A>B output line 40 thereof, shown in FIG. 3-G. Accordingly, a logical "0" will appear on A<B output line 42 of digital comparator 38. At the time $T_2$, the status of the data on each of the aforementioned output lines is stored in a flip-flop 44 due to master clock 26 generating a clock pulse, shown in FIG. 3-H, on clock pulse line 46. Consequently, flip-flop 44 stores the sense of direction of the changing data, i.e., the trend as increasing or decreasing.

The previously mentioned clock pulse during the time interval $T_2$ to $T_3$, as shown in FIG. 2, is at an up level and gates a logical "1" into both input B and input C of full adder 48 via gates 50 and 52, respectively. This operation, in effect, adds a logical "1" and simultaneously substracts a logical "1" from the data on data bus A inputted to full adder 48 on input A thereof. Hence, the output of full adder 48 is unchanged, and in the present example, will have a value of 135 knots, the "pointer on" condition. The digital number representing 135 knots is decoded in 7-bit decoder 32 which activates the appropriate one of a plurality of lamp drivers 54 to light the appropriate lamp pairs of the plurality of lamp pairs 16 (see FIG. 1). In FIG. 1, the foregoing indication is represented by the numeral 18, aforementioned. This lamp on time indicative of a "pointer on" condition is also shown in FIG. 3-I. When the clock pulse goes to a down level at a time $T_3$, gates 50 and 52 are opened and a logical "1" appears at input B and a logical "0" appears at input C of full adder 48 during the time interval $T_3$ to $T_4$. This action will cause one bit to be substracted from the current data value (135) on data bus A and at input A of full adder 48. Hence, a data value of 134 is presented to 7-bit decoder 32, but only for the time period $T_3$ to $T_4$, as shown in FIG. 3-J. The duty factor of the clock pulse is adjusted so that the time interval $T_2$ to $T_3$ is greater than the time interval $T_3$ to $T_4$. This time differential determines the relative intensities of the lamp pairs 16 in question. In the example, and shown in FIG. 1, a lamp pairs 16, at an airspeed of 135 knots represented by the numeral 18, is brightly lit relative to a trend indication at 134 knots represented by the numeral 20. Thus, the dimly lit lamp pairs 16 represented by numeral 20, gives a trend indication that the airspeed is or was increasing.

The frequency of operation (144 Hz) is selected so that the appropriate lamp pairs 16 appear to be lit continuously without any visible flicker. If the linear analog voltage, shown in FIG. 3-A, begins to decrease, digital comparator 38 will output a logical "1" on A<B output line 42 which causes one bit to be added to the value on data bus A. As previously discussed, the forgoing occurs in full adder 48. This action will cause the trend indication to shift to the other side (at 136 knots) of the "pointer on" condition indicated by numeral 18 in FIG. 1.

To those skilled in the art, many modifications and variations of the present invention are possible in light of the above teachings. It is therefore to be understood that the present invention can be practice otherwise than as specifically described herein and still be within the spirit and scope of the appended claims.

What is claimed is:

1. A linear digitally activated airspeed/trend indicator for indicating and displaying the airspeed of a landing aircraft and for indicating the airspeed trend as either increasing or decreasing in response to a linear analog voltage representative of the airspeed, which comprises:

a linear scale for indicating the airspeed and the airspeed trend in a predetermined airspeed range of 80 to 179 knots and including a corresponding mark for each airspeed knot within the range;

a plurality of juxtaposed display cubicles in alignment and cooperation with said linear scale for indicating and displaying the airspeed and airspeed trend as increasing or decreasing in the predetermined airspeed range, said plurality of juxtaposed display cubicles having frosted front surfaces for diffusing light and distributing it evenly so as to eliminate point sources of light;

a plurality of lamp pairs, each pair being connected in parallel, and each pair being disposed in one of said plurality of juxtaposed display cubicles; and digital/electronic circuitry for lighting the appropriate one of said plurality of lamp pairs to indicate and display in response to the linear analog voltage representative of a corresponding particular airspeed in the predetermined airspeed range, and for lighting at a lower intensity, an adjacent one of said plurality of lamp pairs to the left or right of the appropriate one of said plurality of lamp pairs to indicate and display the trend of the particular airspeed as increasing or decreasing, respectively.

2. The airspeed/trend indicator of claim 1 wherein said digital/electronic circuitry further includes:

an analog-to-digital converter being driven at its analog voltage input line by the linear analog voltage for converting thereof, during a conversion period, into digital data representative of the airspeed;

a master clock for generating, in a predetermined time sequence, start pulses, latch pulses and clock pulses, said master clock being operatively connected to said analog-to-digital converter such that one of the start pulses causes initiation of the conversion period in said analog-to-digital converter;

a decoder having a data input and an inhibit input, the inhibit input being operatively connected to the inhibit output of said analog-to-digital converter such that the outputs of said decoder are inhibited by an inhibit pulse from said analog-to-digital converter present during the conversion period for keeping off said plurality of lamp pairs to prevent erroneous flickering during the conversion period;

a data latch operatively connected to said master clock and to the output of said analog-to-digital converter for storing the digital data representative of the airspeed therefrom during a predetermined time interval between latch pulses generated by said master clock;

a digital comparator operatively connected to the data output of said analog-to-digital converter and to the output of said data latch for comparing the value of the digital data representative of the airspeed with the value of the digital data stored in said data latch such that when the value of the former is greater than the value of the latter, said digital comparator will output a logical "1" on one output line and a logical "0" on the other output line thereof, and vice versa;

a flip-flop operatively connected to said digital comparator and said master clock for storing the status of the data on the one output line and the other output line of said digital comparator when said master clock generates one of the clock pulses;

a first gate operatively connected at one input to a first output of said flip-flop, and at another input to said master clock such that when the one of the clock pulses is at an up level, the output of said first gate is at a logical "1" regardless of the status of the data at the one input thereof, and such that when the one of the clock pulses is at a down level, the output of said first gate is the same as the data at the one input thereof;

a second gate operatively connected at one input to a second output of said flip-flop, and at another input to said master clock such that when the one of the clock pulses is at the up level, the output of said second gate is at a logical "1" regardless of the status of the data at the one input thereof, and such that when the one of the clock pulses is at the down level, the output of said second gate is the same as the data at the one input thereof;

a full adder operatively connected at first, second and third inputs to the data output of said analog-to-digital converter, the output of said second gate, and the output of said first gate, respectively, such that when logical "1's" are gated into the second and third inputs of said full adder, the output thereof is the same value as the digital data representative of the airspeed on the data output of said analog-to-digital converter and connected at the first input of said full adder, and such that when a logical "1" appears at the second input of said full adder and a logical "0" appears at the third input thereof one bit is substracted from the data at the first input and provided at the output of said full adder, and such that when a logical "0" appears at the second input of said full adder and a logical "1" appears at the third input thereof one bit is added to the data at the first input and provided at the output of said full adder, the output of said full adder being operatively connected to the data input of said decoder; and a plurality of lamp drivers each operatively connected at its input to a corresponding one of the outputs of said decoder, and each output of said plurality of lamp drivers being operatively connected to corresponding ones of said plurality of lamp pairs, such that when the data representative of the airspeed is decoded in said decoder, the appropriate one of said plurality of lamp drivers is activated, thereby lighting the appropriate one of said plurality of lamp pairs.

3. The airspeed/trend indicator of claim 2 wherein the duty factor of the clock pulses is adjusted so that the time interval that clock pulses are at an up level, corresponding to a pointer on condition, is greater than the time interval that the clock pulses are at a down level corresponding to a trend condition.

4. The airspeed/trend indicator of claim 3 wherein the frequency of the start pulses is at least 60 Hz.

5. The airspeed/trend indication of claim 4 wherein the conversion period is approximately 20 microseconds.

6. The airspeed/trend indicator of claim 2 wherein said decoder is a 7-bit decoder.

* * * * *